United States Patent
Sato et al.

(10) Patent No.: US 6,491,785 B1
(45) Date of Patent: Dec. 10, 2002

(54) ULTRASONIC VIBRATION BONDING MACHINE

(75) Inventors: Shigeru Sato, Fukuoka-ken (JP); Mitsugu Katsumi, Fukuoka-ken (JP); Seiya Nakai, Fukuoka-ken (JP)

(73) Assignee: Ultex Corporation, Fukuoka (JP)

( * ) Notice: Subject to any disclaimer, the term of this patent is extended or adjusted under 35 U.S.C. 154(b) by 170 days.

(21) Appl. No.: 09/597,567

(22) Filed: Jun. 20, 2000

(30) Foreign Application Priority Data

Jun. 16, 1999 (JP) .......................................... 11-170343

(51) Int. Cl.$^7$ .............................................. B23K 21/00
(52) U.S. Cl. ................... 156/379.6; 156/379.8; 156/358; 228/1.1
(58) Field of Search ............................... 156/73.1, 358, 156/379.6, 379.8; 228/110.1, 1.1

(56) References Cited

U.S. PATENT DOCUMENTS

| | | |
|---|---|---|
| 3,697,837 A | 10/1972 | Wayne |
| 5,110,381 A * | 5/1992 | Heckard et al. ............ 156/358 |
| 5,772,814 A * | 6/1998 | Grewell ...................... 156/351 |

FOREIGN PATENT DOCUMENTS

| | | |
|---|---|---|
| EP | 0421018 | 4/1991 |
| EP | 0822741 | 2/1998 |
| JP | 2693473 | 9/1997 |
| JP | 10-22308 | 1/1998 |
| JP | 10-22309 | 1/1998 |
| JP | 11-117912 | 4/1999 |

* cited by examiner

Primary Examiner—Michael W. Ball
Assistant Examiner—John T. Haran
(74) Attorney, Agent, or Firm—Kanesaka & Takeuchi

(57) ABSTRACT

An ultrasonic vibration bonding machine which enables appropriate bonding by selecting a pressure curve according to the sizes of portions to be bonded together and the physical properties of their materials and the like. Pressure inside the pressure chamber of an air cylinder which is a pressure control unit for bonding work and the normal rotation and reverse rotation of a motor which constitutes part of a vertical drive unit for bonding work are controlled to bond together a first member and a second member with ultrasonic vibration under pressure which rises from a first pressure set value to a second pressure value from a vibration start time.

3 Claims, 2 Drawing Sheets

ULTRASONIC VIBRATION BONDING MACHINE

BACKGROUND OF THE INVENTION

1. Field of the Invention

Figure 1:
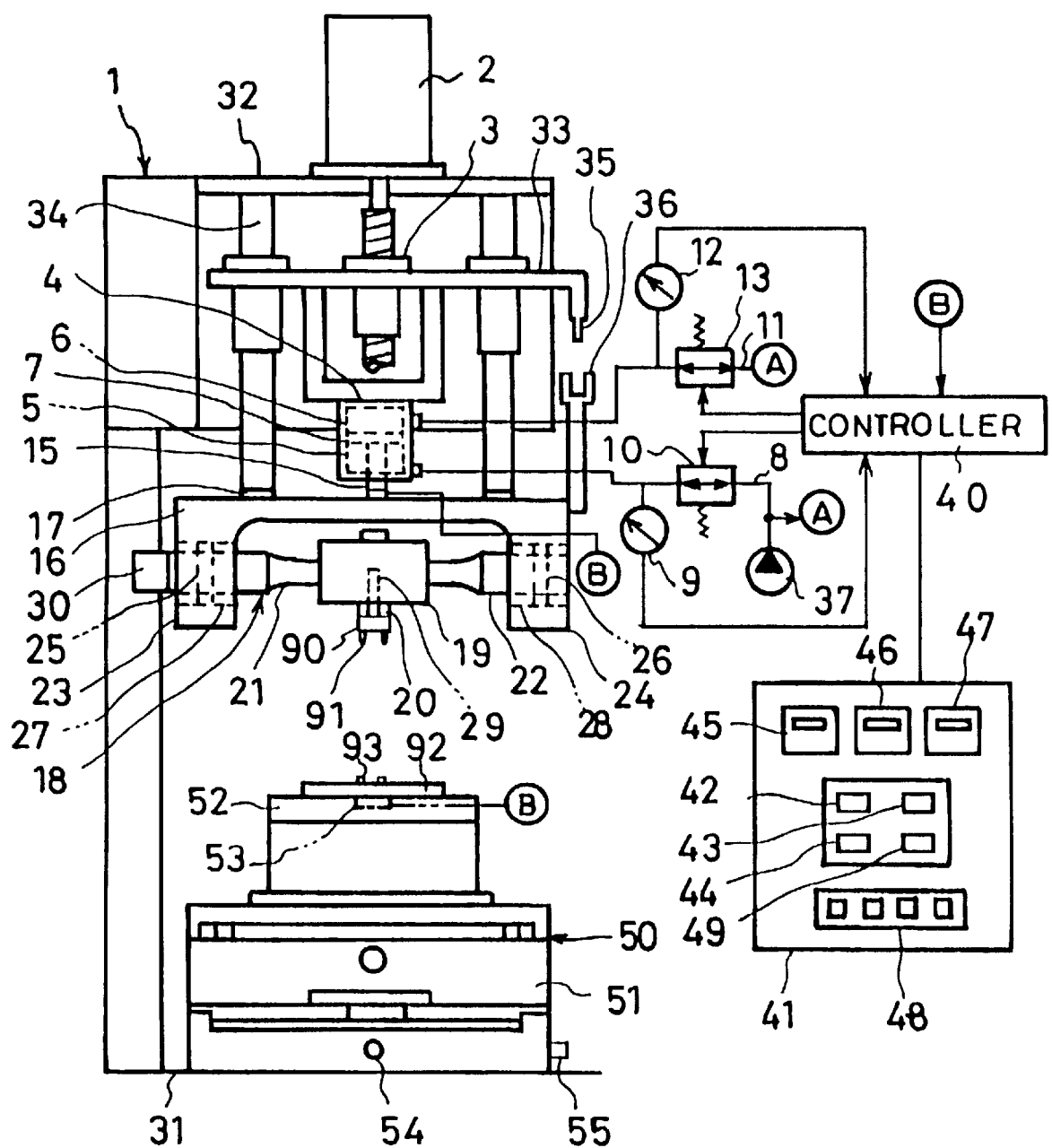

The present invention relates to an ultrasonic vibration bonding machine for bonding a plurality of members which are placed one upon another with ultrasonic vibration.

2. Description of the Prior Art

As disclosed by Japanese Laid-open Patent Application No. 10-22308, the Applicant proposed an ultrasonic vibration bonding machine for bonding a plurality of members which are placed one upon another with ultrasonic vibration.

When a plurality of members which are placed one upon another are to be bonded together by the above ultrasonic vibration bonding machine, the following bonding failures may occur according to the sizes of portions to be bonded together and the physical properties of their materials and the like: the bonded portions are pressed excessively when pressure applied to these portions of the plurality of members placed one upon another is too strong, or the bonded portions are separated from one another when pressure is too weak.

To cope with these, the present invention provides an ultrasonic vibration bonding machine which enables appropriate bonding by selecting a pressure curve according to the sizes of portions to be bonded together and the physical properties of their materials and the like.

According to a first aspect of the present invention, there is provided an ultrasonic vibration bonding machine for bonding a plurality of members placed one upon another with ultrasonic vibration by pressure holding the plurality of members between a resonator supported by a bonding unit and the mount table of a mounting unit and transmitting ultrasonic vibration to the resonator from a transducer connected to the resonator, wherein the bonding unit comprises a vertical drive unit for bonding work and a pressure control unit for bonding work.

According to a second aspect of the present invention, there is provided an ultrasonic vibration bonding machine, wherein the vertical drive unit moves the resonator toward the mount table side of the mounting unit, and the pressure control unit selects pressure for a time interval from the time when the plurality of members placed one upon another are held between the resonator and the mount table to the time when they are bonded together with ultrasonic vibration according to the sizes of portions to be bonded together and the physical properties of their materials and the like. Thereby, the plurality of members placed one upon another are bonded together properly without being pressed excessively or separated from one another.

According to a third aspect of the present invention, there is provided an ultrasonic vibration bonding machine, wherein the bonding unit is composed of a motor and a bolt-nut unit connected to the output shaft of the motor and a holder supporting the resonator. Compared with the case where the bonding unit is composed of a cylinder which moves only linearly, the bonding unit converts rotary motion into linear motion, thereby making it easy to control the speed of the vertical movement of the resonator.

According to a fourth aspect of the present invention, there is provided an ultrasonic vibration bonding machine, wherein the pressure control unit is composed of an air cylinder connected to the output end of the bonding unit and a holder supporting the resonator. Compared with a pressure control unit which is composed of an element other than the air cylinder, the pressure control unit can adjust pressure applied to the plurality of members placed one upon another with air which is a compressed elastic fluid.

According to a fifth aspect of the present invention, there is provided an ultrasonic vibration bonding machine, wherein the pressure control unit comprises a pressure supply system for supplying pressurized air to an equilibrium chamber and a pressure chamber formed in the air cylinder and setting means for setting the pressure of pressurized air to be supplied from the pressure supply system to the equilibrium chamber according to the total weight of elements connected to the pressure control unit and the pressure of pressurized air to be supplied from the pressure supply system to the pressure chamber according to the sizes and materials of members to be bonded together. Therefore, the pressure control unit can set pressure control conditions such as a vibration start pressure set value, first pressure set value, second pressure set value and equilibrium pressure set value.

According to a sixth aspect of the present invention, there is provided an ultrasonic vibration bonding machine, wherein a load sensor is provided on a holder supporting the resonator. Therefore, the total weight of the elements supported by the pressure control unit can be detected accurately and does not need to be calculated.

The above and other objects, features and advantages of the invention will become more apparent from the following description when taken in conjunction with the accompanying drawings.

BRIEF DESCRIPTION OF THE ACCOMPANYING DRAWINGS

Figure 2:
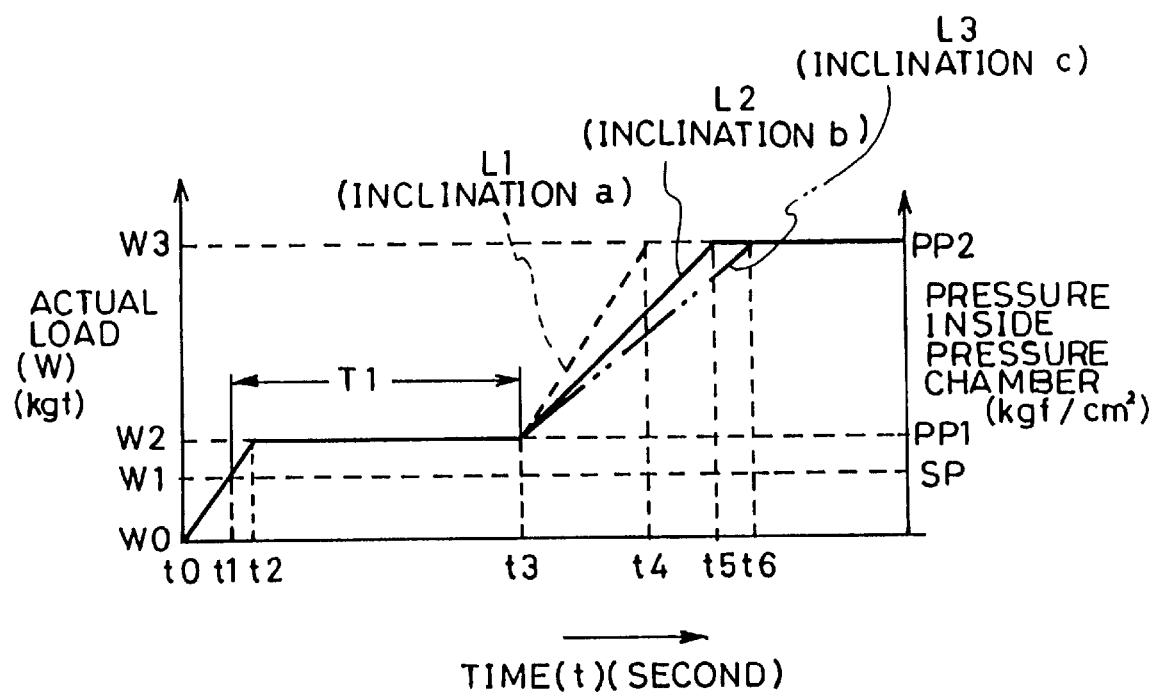

FIG. 1 is a structural diagram of an ultrasonic vibration bonding machine according to an embodiment of the present invention; and FIG. 2 is a time chart of bonding work in the embodiment.

DETAILED DESCRIPTION OF THE PREFERRED EMBODIMENT

FIG. 1 shows an ultrasonic vibration bonding machine according to an embodiment of the present invention. In this embodiment, this machine is used to surface mount a semiconductor chip 90 as a second member on a circuit board 92 as a first member. The semiconductor chip 90 has a plurality of plate-like or spherical pads 91 as connection terminals on one side. The circuit board 92 has a plurality of plate-like or spherical pads 93 as connection terminals at a chip mounting position on one side. The pads 91 on the chip side and the pads 93 on the substrate side are the same in number and located at corresponding positions. The semiconductor chip 90 is surface mounted on the circuit board 92 by bonding together the pads 91 on the chip side and the pads 93 on the substrate side 92 with ultrasonic vibration.

The ultrasonic vibration bonding machine comprises a bonding unit 1, controller 40 incorporating a computer, operation board 41 and mounting unit 50. The bonding unit 1 comprises a vertical drive unit for bonding work which consists of a motor 2 such as a servo motor and a bolt-nut unit 3 and a pressure control unit for bonding work which is an air cylinder 4. Inside the air cylinder 4, a lower equilibrium chamber 5 and an upper pressure chamber 6 are separated from each other by a piston 7. Pressurized air which bears the total weight of elements supported by the air cylinder 4 is supplied into the equilibrium chamber 5 from an equilibrium air supply system 8 and pressurized air equivalent to pressure required for bonding is supplied into the pressure chamber 6 from a pressurized air supply system 11 according to the sizes of the portions to be bonded together and the physical properties of their materials and the like. Denoted by 37 is an air pump which is a pressurized air supply source for the equilibrium air supply system 8 and the pressurized air supply system 11, and A is a connector for connecting the pressurized air supply system 11 to the air pump 37.

In this embodiment, the total weight of the elements supported by the air cylinder 4 is the total weight of the piston 7, piston rod 15, holder 16, guide rods 17, resonator 28, transducer 30, semiconductor chip 90 and the like. A load sensor 38 such as a load cell is interposed between the piston rod 15 and the holder 16 and connected to the piston rod 15 and the holder 16. Thereby, the load sensor 38 detects both upward tractive force and downward tractive force to detect the total weight of the elements supported by the air cylinder 4 accurately. The load sensor 38 outputs a detection signal to the controller 40. B is a connector for connecting the load sensor 38 to the controller 40.

The controller 40 receives various signals such as the output signal of a pressure sensor 9 provided in the equilibrium air supply system 8, the output signal of a pressure sensor 12 provided in the pressurized air supply system 11, the output signal of the load sensor 38 and set signals set from the operation board 41. When these signals are input, the controller 40 controls a pressure control valve 10 provided in the equilibrium air supply system 8 and a pressure control valve 13 provided in the pressurized air supply system 11 to set pressure inside the equilibrium chamber 5 to an equilibrium pressure set value BP and pressure inside the pressure chamber 6 to a first pressure set value PP1, second pressure set value PP2 or a pressure change having one of a plurality of pressure inclinations "a", "b" and "c" from the first pressure set value PP1 to the second pressure set value PP2. A valve called "precision pressure reducing valve" which makes use of a servo equilibrium unit whose main valve and relief valve are operated by a pilot valve, or an electromagnetic valve called "electronic pressure control valve" which is operated with voltage or current is used as the pressure control valves 10 and 13. For example, the precision pressure reducing valve is structured such that an electric actuator such as a stepping motor expands or contracts a pilot capsule, a pilot valve is moved by the expansion and contraction of the pilot capsule, either one of a main valve and a relief valve is moved by the movement of the pilot valve, and the secondary pressure (pressure on the output side of the valve) of the valve is thereby controlled to a target pressure. The precision pressure reducing valve which makes use of an electric actuator such as a stepping motor is an unknown valve having a new structure.

When an operator operates the first pressure operation portion 42 of the operation board 41 to set the first pressure set value PP1, the operation board 41 displays the set first pressure set value PP1 on a first pressure display portion 45 and outputs it to the controller 40. When the operator operates the second pressure operation portion 43 of the operation board 41 to set the second pressure set value PP2, the operation board 41 displays the set second pressure set value PP2 on a second pressure display portion 46 and outputs it to the controller 40. When the operator operates the equilibrium pressure operation portion 44 of the operation board 41 to set the equilibrium pressure set value BP, the operation board 41 displays the set equilibrium pressure set value BP on an equilibrium pressure display portion 47 and outputs it to the controller 40. A load detected by the load sensor 38 is input into and displayed on the load display portion 48 of the operation board 41 from the controller 40. While pressure inside the equilibrium chamber 5 supplied into the equilibrium chamber 5 from the equilibrium air supply system 8 is in equilibrium with the total weight of elements supported by the air cylinder 4, when the operator operates an unshown reset bottom on the operation board 41, the operation board 41 resets the actual load which is the detection value of the load sensor 38 at that point to zero and displays "0" on the load display portion 48. When the operator operates the vibration start operation portion 49 of the operation board 41, the operation board 41 displays a vibration start pressure set value SP on the load display portion 48 and outputs it to the controller 40. The vibration start pressure set value SP is smaller than the first pressure set value PP1 which is smaller than the second pressure set value PP2.

In the bonding unit 1 of this embodiment, the motor 2 is placed on a fixed base 32 installed on an installation base 31, the screw rod of the bolt-nut unit 3 is connected to the output shaft of the motor 2, the nut of the bolt-nut unit 3 is fixed on a lift base 33, and the air cylinder 4 is attached to the lift base 33. The resonator 18 is attached to the holder 16 connected to the piston rod 15, and the transducer 30 is connected coaxial to one end of the resonator 18 by an unshown headless screw and a threaded hole. When the motor 2 turns in a normal direction, the screw rod of the bolt-nut unit 3 turns in a normal direction, and the lift base 33 is descended by the nut mated with the screw rod. When the motor 2 turns in an opposite direction, the screw rod of the bolt-nut unit 3 turns in an opposite direction, and the lift base 33 is ascended by the nut. The lift base 33 moves vertically in slide contact with right and left guide poles 34 projecting from the under surface of the fixed base 32 in such a manner that it is not turned. The guide rods 17 are inserted in the guide poles 34 so that they can move vertically. The lower ends of the guide rods 17 are connected to the holder 16. Thereby, the guide rods 17 are moved vertically by the vertical movement of the lift base 33 and the expansion and contraction of the air cylinder 4 to keep the holder 16 in parallel to the installation base 31.

The resonator 18 of this embodiment comprises a horn 19 and two boosters 21 and 22 connected coaxial to the both sides of the horn 19 by unshown headless screws and threaded holes, and the boosters 21 and 22 are supported by arm portions 23 and 24 extending downward from right and left sides of the holder 16 so that the resonator 18 is held by the holder 16 at both sides. The transducer 30 is connected coaxial to the booster 21 by an unshown headless screw and a threaded hole. The transducer 30 is an energy converter such as a piezoelectric element or magnetostrictive element for converting electric energy into mechanical energy, which generates vibration of a vertical ultrasonic wave having a predetermined frequency with power supplied from an unshown ultrasonic wave generator. The maximum vibration amplitude point of ultrasonic vibration is existent at the output end of the transducer 30 connected to the booster 21.

The horn 19 is as long as the wavelength of the resonance frequency when it resonates with ultrasonic vibration from the transducer 30, and the boosters 21 and 22 are as long as half the wavelength of resonance frequency when they resonate with ultrasonic vibration from the transducer 30. The horn 19 is shaped like a rectangular plate having the maximum vibration amplitude point at right and left end portions and central portion and has rectangular pillar-like bonding working portions 20 which project outward from the upper and lower surfaces at the maximum vibration amplitude point of the center portion. The boosters 21 and 22 are cylindrical and have the maximum vibration amplitude point at both right and left end portions and annular support portions 25 and 26 which project from the outer surface at the minimum vibration amplitude point of the center portion. The support portions 25 and 26 are stored in through holes 27 and 28 formed coaxial in the arm portions 23 and 24, respectively. Portions divided by an unshown slit formed across the through holes 27 and 28 and the outer surfaces of the arm portions 23 and 24 are fastened together by unshown bolts so that the arm portions 23 and 24 hold the support portions 25 and 26, respectively. A suction hole 29 is formed in each of the bonding working portions 20 to adsorb the semiconductor chip 90. The suction hole 29 is connected to a suction and adsorption system having an unshown vacuum pump and valves so that the semiconductor chip 90 is adsorbed to the bonding working portion 20 by the suction and adsorption system through the suction hole 29.

The mounting unit 50 comprises an XYθ drive unit 51 installed on the installation base 31 and a mount table 52 set on the XYθ drive unit 51. The XYθ drive unit 51 moves in directions X and Y which are longitudinal and transverse directions on the plane parallel to the installation base 31 and turns on a certain point within the plane in a direction θ which is a rotation angle within the plane parallel to the installation base 31 to control the position of the mount table 52 so that the chip mounting position of the circuit board 92 which is mounted on the top of the mount table 52 parallel to the installation base 31 should become a predetermined mounting position.

The XYθ drive unit 51 has an X direction elevation angle control unit 54 and a Y direction elevation angle control unit 55 with respect to the installation base 31. When it is unknown whether parallelism between the top surface of the mount table 52 and the under surface of the bonding working portion 20 is kept as in the case where mounting preparations are made, the resonator 18 is exchanged, or the mount table 52 is exchanged, the X direction elevation angle control unit 54 and the Y direction elevation angle control unit 55 control the elevation angle in the direction X of the XYθ drive unit 51 with respect to the installation base 31 and the elevation angle in the direction Y of the XYθ drive unit 51 with respect to the installation base 31 to ensure parallelism between the top surface of the mount table 52 and the under surface of the bonding working portion 20.

The bonding unit 1 and the mounting unit 50 comprise abnormality stop means. This abnormality stop means has a sensor dog 35 installed on the lift base 33 and a limit sensor 36 installed on the holder 16. Right before the piston 7 makes a full stroke toward the pressure chamber 6 at the time of bonding, the limit sensor 36 outputs an electric signal for the detection of the sensor dog 35 to the controller 40 which in turn stops the rotation of the motor 2. This prevents the force of the vertical drive unit from being applied to the bonded portions of the pads 91 and the pads 93 on the substrate side. The sensor dog 35 may be installed on the holder 16 and the limit sensor 36 may be installed on the lift base 33. The limit sensor 36 may be of either a contact type or non-contact type.

FIG. 2 is a time chart of bonding work of this embodiment. Time t0 when the pads 91 on the chip side and the pads 93 on the substrate side to be bonded together contact each other, the oscillation start time t1 of the transducer 30, first bonding start time t2, first bonding end time t3 and second load attaining times t4, t5 and t5 are plotted on the axis of abscissas, actual load W0 (W0=BP−PP1) when the pads 91 on the chip side and the pads 93 on the substrate side contact each other, actual load WI (W1=SP) at the oscillation start time t1, actual load W2 (W2=PP1) at the first bonding start time t2 and actual load W3 (W3=PP2) at the secondary load attaining times t4 to t6 are plotted on the left axis of ordinates, and a vibration start pressure set value SP, a first pressure set value PP1 and a second pressure set value PP2 are plotted on the right axis of ordinates.

A description is subsequently given of the operation of this embodiment. When the operator operates the operation board 41 to sets the vibration start pressure set value SP, equilibrium pressure set value BP, first pressure set value PP1, second pressure set value PP2, the total oscillation time T of the transducer 30, the first bonding time Ti (t3−t1 in FIG. 2) of the transducer 30 and the inclination of a pressure change from the first pressure set value PP1 to the second pressure set value PP2 according to the sizes of the pads 91 on the chip side and the pads 93 on the substrate side to be bonded together and the physical properties of their materials and the like.

As shown in FIG. 2, the above inclination is selected from a plurality of inclinations such as an inclination "a" shown by a dotted line L1, an inclination "b" shown by a solid line L2, and an inclination "c" shown by a two-dot chain line L3, according to the sizes of portions to be bonded together and the physical properties of their materials and the like. Therefore, the plurality of inclinations "a" to "c" are pre-stored in the controller 40, an inclination suitable for the sizes of portions to be bonded together and the physical properties of their materials and the like is selected from the inclinations "a" to "c" by operating the operation board 41, and the selected inclination is set in the controller 40. For example, when the operator selects the inclination "a", pressure inside the pressure chamber 6 changes from the first pressure set value PP1 to the second pressure set value PP2 during a time interval between the time t3 and the time t4 of FIG. 2. When the operator selects the inclination "b", pressure inside the pressure chamber 6 changes from the first pressure set value PP1 to the second pressure set value PP2 during a time interval between the time t3 and the time t5 of FIG. 2. When the operator selects the inclination "c", pressure inside the pressure chamber 6 changes from the first pressure set value PP1 to the second pressure set value PP2 during a time interval between the time t3 and the time t6 of FIG. 2.

By setting the above control conditions, the controller 40 drives the pressure control valves 10 and 13 to set pressure inside the equilibrium chamber 5 to the equilibrium pressure set value BP and pressure inside the pressure chamber 6 to the first pressure set value PP1. Thereby, the piston 7 is located at an intermediate position in a vertical direction in the air cylinder 4, more specifically its downward movement limit position in the air cylinder 4. The resonator 18 of the bonding unit 1 stops at its upward movement limit position, the semiconductor chip 90 is sucked and adsorbed to the bonding working portion 20, the pads 91 on the lip side of the semiconductor chip 90 face down, the circuit board 92 is mounted on the mount table 52 of the mounting unit 2, and the pads 92 on the substrate side of the circuit board 92 face up. In this state, a CCD camera which is an unshown metering instrument outputs an electric signal converted from an image signal of the pads 91 on the lip side and the pads 93 on the substrate side to the controller 40. Thereafter, the controller 40 computes displacement between the pads 91 on the lip side and the pads 93 on the substrate side. According to the result of computation, the controller 40 corrects the position of the mount table 52. That is, the mount table 52 is driven in directions X, Y and θ to correct the position of the circuit board 92 based on the semiconductor chip 90 so that the positions of the pads 91 on the lip side are aligned with the positions of the pads 93 on the substrate side accurately.

Thereafter, when the operator turns on the start button of the operation board 41, the controller 40 drives the motor 2 in a normal direction and the resonator 18 of the bonding unit 1 descends. Thereby, as shown in FIG. 2, at the time t0, the pads 91 on the lip side are pressed against the pads 93 on the substrate side. Subsequently, the capacity of the pressure chamber 6 is reduced by the descent of the lift base 33 by the rotation of the motor 2 and the ascent of the piston rod 7 by collision between the pads 91 on the lip side and the pads 93 on the substrate side, whereby pressure inside the pressure chamber 6 increases. When the actual load W1 (W1=SP) is input into the controller 40 from the load sensor 38 at the time t1, the controller 40 instructs the transducer 30 to start oscillation. Thereby, the transducer 30 generates ultrasonic vibration, the resonator 18 resonates with the ultrasonic vibration, ultrasonic vibration caused by the resonance is applied to contact portions between the pads 91 on the lip side and the pads 93 on the substrate side from the bonding working portion 20 through the semiconductor chip 90, and the bonding of the pads 91 on the lip side and the pads 93 on the substrate side starts.

The capacity of the pressure chamber 6 is further reduced by the descent of the lift base 33 by the rotation of the motor 2 and the ascent of the piston rod 7 by collision between the pads 91 on the lip side and the pads 93 on the substrate side, whereby pressure inside the pressure chamber 6 increases. When the actual load W2 is input into the controller 40 from the load sensor 38 at the time t2, the controller 40 controls an electric actuator such as a stepping motor for driving the pilot valve of the pressure control valve 13. Thereby, the pressure of the pressure chamber 6 is maintained at the first pressure set value PP1 so that the semiconductor chip 90 is pressed against the circuit board 92 by pressure which is the difference between the first pressure set value PP1 and the equilibrium pressure set value BP for a time interval between the time t2 and the time t3.

When the operator selects and sets the inclination "b", pressure for pressing the semiconductor chip 90 against the circuit board 92 after the time t3 is controlled to change according to the solid line L2 of FIG. 2. Therefore, the controller 40 controls the electric actuator of the pressure control valve 13 at the time t3. This control is pressure control based on a pressure curve that the pressure of the pressure chamber 6 rises from the first pressure set value PP1 to the second pressure set value PP2 according to the solid line L2. This pressure change is detected by the load sensor 38. Thereafter, when the time elapsed after the time t1 reaches the total bonding time T, bonding between the pads 91 on the lip side and the pads 93 on the substrate side with ultrasonic vibration completes, and the controller 40 instructs the transducer 30 to stop oscillation and switches the positive drive to the reverse drive of the motor 2. Thereby, the resonator 18 of the bonding unit 1 ascends and the oscillation of ultrasonic vibration stops.

Subsequently, when the resonator 18 reaches its upward movement limit position, the controller 40 stops the reverse rotation of the motor 2. The controller 40 controls the electric actuator of the pressure control valve 13 when the resonator 18 begins to ascend, while the resonator 18 is rising, or when the resonator 18 reaches its upward movement limit position. This control is the control of the pressure of the pressure chamber 6 from a level reached at the total bonding time T on the solid line L2 to the first pressure set value PP1. Thereby, the cycle of mounting one semiconductor chip 90 on the circuit board 92 ends.

In short, according to this embodiment, the operator sets in the controller 40 control conditions such as the vibration start pressure set value SP, first pressure set value PP1, second pressure set value PP2, equilibrium pressure set value BP, first bonding time T1, total bonding time T and an inclination selected from a plurality of inclinations "a" to "c" according to the sizes and materials of portions to be bonded together to control pressure inside the pressure chamber 6 of the air cylinder 4 which is the pressure control unit for bonding work and the normal rotation and reverse rotation of the motor 2 constituting part of the vertical drive unit for bonding work. Thereby, the circuit board 92 which is the first member and the semiconductor chip 90 which is the second member are bonded together while they receive ultrasonic vibration under pressure which gradually rises from the vibration start pressure set value SP to the first pressure set value PP1 and then the second pressure set value PP2.

As the above control conditions such as the vibration start pressure set value SP, first pressure set value PP1, second pressure set value PP2, equilibrium pressure set value BP, first bonding time T1 and total bonding time t (T>T1), values obtained from the sizes of the pads 91 on the chip side and the pads 93 on the substrate side to be bonded together and the physical properties of their materials and the like are used. For example, when the portions to be bonded of the first member and the second member are large or hard, the second pressure set value PP2 is set to a relatively large value and when the portions to be bonded of the first member and the second member are small or soft, the second pressure set value PP2 is set to a relatively small value. Therefore, according to this embodiment, pressure required for bonding can be set according to the sizes of the portions to be bonded together and the physical properties of their materials and the like, and appropriate bonding with ultrasonic vibration can be effected without the excessive pressing or separation of the bonded portions.

According to this embodiment, since the bonding unit 1 comprises the vertical drive unit for bonding work which consists of the motor 2 and the bolt-nut unit 3 and the pressure control unit for bonding work which is the air cylinder 4, the force of the vertical drive unit is not applied to the portions to be bonded together at the time of bonding but only the pressure of the pressure control unit is applied to the portions to be bonded together at the time of bonding. That is, when the motor 2 turns in a normal direction, the resonator 18 of the bonding unit 1 descends, and the pads 91 on the lip side are pressed against the pads 93 on the substrate side, the piston 7 ascends. Therefore, descending force generated by the motor 2 is absorbed by the ascent of the piston 7 and is not applied to the portions to be bonded, and only pressure corresponding to the pressure of the pressure chamber 6 is applied to the portions to be bonded together. Consequently, even when the revolution speed of the motor 2 is raised and the descending speed of the resonator 18 is raised, sharply increasing impact force is not applied to the portions to be bonded together, thereby making it possible to eliminate such inconvenience as the breakage of the semiconductor chip 90 or the circuit board 92.

Even if the capacity of the pressure chamber 6 is reduced by the ascent of the piston 7, pressure inside the pressure chamber 6 is maintained at the first pressure set value PP1 by the pressure control of the pressure control valve 13. Therefore, pressure inside the pressure chamber 6 can be maintained at the first pressure set value PP1 and an inclination selected for a pressure rise from the first pressure set value PP1 to the second pressure set value PP2 in proportion to a reduction in the capacity of the pressure chamber 6 without stopping the normal rotation of the motor 2 during the total bonding time T, thereby eliminating a bad influence upon bonding.

Further, according to this embodiment, since the abnormality stop means which consists of the sensor dog 35 and the limit sensor 36 is provided, the normal rotation of the motor 2 is stopped forcedly before the piston 7 reaches its upward movement limit position, whereby the descending force of the motor 2 is not applied to the portions to be bonded together.

In the above embodiment, in the initial stage of bonding work where the resonator 18 of the bonding unit 1 stops at its upward movement limit position, the semiconductor chip 90 is sucked and adsorbed to the resonator 18. When the semiconductor chip 90 is placed on the circuit board 92 and the bonding working portion 20 presses the semiconductor chip 90 against the circuit board 92 by the descent of the resonator 18, the suction hole 29 can be eliminated from the resonator 18. Thus, the resonator 18 becomes simple in structure.

In the above embodiment, control conditions are set in the controller 40 from the operation board 41. When a plurality of control conditions based on the sizes and materials of the portions to be bonded together are prestored in the controller 40 and appropriate values are selected from the plurality of prestored control conditions according to the sizes and materials of the portions to be bonded together and set, bonding work becomes easy.

In the above embodiment, the load sensor 38 is provided between the piston rod 15 and the holder 16. A load sensor 53 shown by. a two-dot chain line in FIG. 1 and corresponding to the above load sensor 38 may be placed on the mount table 52 in place of the load sensor 38. In this case, when the load sensor 53 is provided at a position corresponding to the bonding working portion 20 of the resonator 18, a more accurate actual load can be detected. Since the load sensor 53 cannot detect the total weight of elements supported by the air cylinder 4 while the piston 7, piston rod 15, guide rods 17, resonator 18, transducer 30, semiconductor chip 90 and the like are held by the holder 16 as in the above embodiment, the total weight of the piston 8, piston rod 15, holder 16, guide rods 17, resonator 18, transducer 30, semiconductor chip 90 and the like must be obtained by calculation, or desirably the total weight of elements supported by the air cylinder 4 must be detected with the load sensor 53 by opening the equilibrium chamber 5 and the pressure chamber 6 to the air, moving at least the motor 2 to descend the holder 16, and bringing the bonding working portion 20 or the semiconductor chip 90 adsorbed to the bonding working portion 20 into contact with the mount table 52.

What is claimed is:

1. An ultrasonic vibration bonding machine for bonding a plurality of members placed one upon another with ultrasonic vibration, comprising;

a bonding unit including a pressure control unit having an air cylinder connected to an output end of the bonding unit and a pressure supply system for supplying pressurized air to an equilibrium chamber and a pressure chamber provided in the air cylinder;

pressure setting means for setting a pressure of pressurized air to be supplied to the equilibrium chamber according to a total weight of elements connected to the pressure control unit and a pressure of the pressurized air to be supplied to the pressure chamber according to sizes and materials of the members;

a resonator supported by the bonding unit;

a transducer connected to the resonator and transmitting the ultrasonic vibration to the resonator; and a mounting unit having a mount table, the plurality of members being pressure held between the mount table and the resonator.

2. The ultrasonic vibration bonding machine according to claim 1, wherein the bonding unit further comprises a vertical drive unit including a motor and a bolt-nut connected to an output shaft of the motor, and a holder supporting the resonator.

3. The ultrasonic vibration bonding machine according to claim 1, which further comprises a load sensor to detect the total weight of the elements.

* * * * *